(12) United States Patent
Hsieh (10) Patent No.: US 11,764,255 B2
(45) Date of Patent: Sep. 19, 2023

(54) MEMORY CIRCUIT, MEMORY DEVICE AND OPERATION METHOD THEREOF

(71) Applicant: National Central University, Taoyuan (TW)

(72) Inventor: E Ray Hsieh, Taoyuan (TW)

(73) Assignee: National Central University, Taoyuan (TW)

(*) Notice: Subject to any disclaimer, the term of this patent is extended or adjusted under 35 U.S.C. 154(b) by 0 days.

(21) Appl. No.: 17/660,837

(22) Filed: Apr. 27, 2022

(65) Prior Publication Data
US 2022/0352300 A1 Nov. 3, 2022

Related U.S. Application Data

(60) Provisional application No. 63/174,539, filed on Apr. 28, 2021.

(30) Foreign Application Priority Data

Apr. 21, 2022 (TW) .................................. 111115307

(51) Int. Cl.
| | | |
|---|---|---|
| G11C 11/40 | (2006.01) | |
| H01L 49/02 | (2006.01) | |
| G11C 11/408 | (2006.01) | |
| G11C 11/4094 | (2006.01) | |
| G11C 11/4096 | (2006.01) | |
| G11C 5/06 | (2006.01) | |
| H01L 29/417 | (2006.01) | |
| H10B 12/00 | (2023.01) | |
| G11C 11/22 | (2006.01) | |
| H10B 53/30 | (2023.01) | |
| H10B 53/40 | (2023.01) | |

(52) U.S. Cl.
CPC .............. *H01L 28/55* (2013.01); *G11C 5/063* (2013.01); *G11C 11/4085* (2013.01); *G11C 11/4094* (2013.01); *G11C 11/4096* (2013.01); *H01L 29/41775* (2013.01); *H10B 12/31* (2023.02); *H10B 12/50* (2023.02); *G11C 11/221* (2013.01); *G11C 11/2255* (2013.01); *G11C 11/2257* (2013.01); *G11C 11/2273* (2013.01); *G11C 11/2275* (2013.01); *H10B 53/30* (2023.02); *H10B 53/40* (2023.02)

(58) Field of Classification Search
None
See application file for complete search history.

(56) References Cited

U.S. PATENT DOCUMENTS 5,689,456 A * 11/1997 Kobayashi ............. H10B 53/00
257/295
6,438,021 B2 * 8/2002 Kato ....................... G11C 11/22
365/145

(Continued)

FOREIGN PATENT DOCUMENTS

TW 200402724 A 2/2004

*Primary Examiner* — Tan T. Nguyen
(74) *Attorney, Agent, or Firm* — CKC & Partners Co., LLC (57) ABSTRACT

The present disclosure provides a memory circuit, a memory device and an operating method of the memory device. The memory device includes a storage transistor, a variable capacitance device and a control transistor. The variable capacitance device is electrically connected to the gate of the storage transistor, and the control transistor is connected to the storage transistor in series.

18 Claims, 9 Drawing Sheets

(56) References Cited

U.S. PATENT DOCUMENTS

| | | | | |
|---|---|---|---|---|
| 6,438,022 B2* | 8/2002 | Schlosser | ............... | H10B 53/00 |
| | | | | 257/E21.664 |
| 6,438,052 B1* | 8/2002 | Sekine | ................... | G11C 11/22 |
| | | | | 365/210.11 |
| 6,717,840 B2* | 4/2004 | Kang | ...................... | G11C 11/22 |
| | | | | 257/E21.664 |
| 6,898,105 B2* | 5/2005 | Sakai | ...................... | G11C 11/22 |
| | | | | 365/145 |
| 7,450,412 B2* | 11/2008 | Kameyama | ............. | G11C 11/22 |
| | | | | 365/49.13 |
| 8,179,712 B2 | 5/2012 | Zheng | | |
| 8,988,927 B2 | 3/2015 | Nazarian et al. | | |
| 2004/0047174 A1* | 3/2004 | Chen | ........................ | G11C 11/22 |
| | | | | 365/145 |
| 2006/0067100 A1* | 3/2006 | Ogiwara | ................. | G11C 11/22 |
| | | | | 365/145 |
| 2015/0098266 A1* | 4/2015 | Chen | .................. | G11C 16/3418 |
| | | | | 257/296 |
| 2016/0027507 A1* | 1/2016 | Chung | ................... | H10B 63/80 |
| | | | | 257/4 |
| 2022/0139440 A1* | 5/2022 | Fujiwara | ............... | G11C 11/405 |
| | | | | 365/149 |

* cited by examiner

MEMORY CIRCUIT, MEMORY DEVICE AND OPERATION METHOD THEREOF

RELATED APPLICATIONS

This application claims priority to U.S. Provisional Patent Application No. 63/174,539, filed Apr. 28, 2021 and Taiwan Patent Application No. 111115307, filed Apr. 21, 2022, the entirety of which is herein incorporated by reference.

BACKGROUND

Field of Invention

The present invention relates to storage circuits and operation methods, and more particularly, a memory circuit, a memory device and an operating method thereof.

Description of Related Art

With the vigorous development of the semiconductor industry, semiconductor components are constantly being introduced. In many application fields, semiconductor memory is widely used in various electronic products.

However, some current memory architectures often suffer from large leakage currents, thereby deteriorating data storage. Therefore, for the above reasons, a new memory device is required to improve performance.

SUMMARY

In one or more various aspects, the present disclosure is directed to a memory circuit, a memory device and an operating method thereof.

One embodiment of the present disclosure is related to a memory device, which includes a storage transistor, a variable capacitance device and a control transistor. The variable capacitor device is electrically connected to the gate of the storage transistor, and the control transistor is connected to the storage transistor in series.

In one embodiment of the present disclosure, the variable capacitance device includes an upper electrode, a lower electrode and a variable capacitance layer. The lower electrode is electrically connected to the gate of the storage transistor. The variable capacitance layer is disposed between the upper electrode and the lower electrode.

In one embodiment of the present disclosure, the variable capacitance layer is a ferroelectric layer.

In one embodiment of the present disclosure, memory device further includes a first contact plug and a first wire. The first contact plug has one end contacting the upper electrode. The first wire contacts another end of the first contact plug, and the first contact plug positioned between the first wire and the upper electrode.

In one embodiment of the present disclosure, the storage transistor includes at least one first gate dielectric layer, at least one first gate electrode layer, a first source/drain diffusion region and a second source/drain diffusion region. The at least one first gate dielectric layer is disposed on an active region. The at least one first gate electrode layer is disposed on the at least one first gate dielectric layer, the at least one first gate electrode layer contacts one end of a gate contact plug, and another end of the gate contact plug contacting the lower electrode of the variable capacitance device. The first source/drain diffusion region and the second source/drain diffusion region are disposed in the active region and positioned at two opposing sides respectively under the at least one first gate electrode layer.

In one embodiment of the present disclosure, memory device further includes a second contact plug and a second wire. The second contact plug has one end contacting the second source/drain diffusion. The second wire contacts another end of the second contact plug, and the second contact plug positioned between the second wire and the second source/drain diffusion region.

In one embodiment of the present disclosure, the control transistor and the storage transistor share the first source/drain diffusion region, and the control transistor includes at least one second gate dielectric layer, at least one second gate electrode layer, a third source/drain diffusion region and the first source/drain diffusion region. The at least one second gate dielectric layer is disposed on the active region. The at least one second gate electrode layer is disposed on the at least one second gate dielectric layer. The third source/drain diffusion region and the first source/drain diffusion region are disposed in the active region and positioned at two opposing sides respectively under the at least one second gate electrode layer.

In one embodiment of the present disclosure, memory device further includes a third contact plug and a third wire. The third contact plug has one end contacting the third source/drain diffusion. The third wire contacts another end of the third contact plug, the third contact plug is positioned between the third wire and the third source/drain diffusion region, where the at least one second gate electrode layer of the control transistor serves as a fourth wire.

Another embodiment of the present disclosure is related to memory circuit, which includes a plurality of memory cells arranged in an array, and each of the memory cells includes a first memory device. The first memory device includes a first storage transistor, a first variable capacitance device and a first control transistor. The first storage transistor has a first gate, a first source/drain and a second source/drain. The first variable capacitance device has one end electrically connected to the first gate of the first storage transistor. The first control transistor has a second gate, a third source/drain and a fourth source/drain, where the fourth source/drain of the first control transistor is electrically connected to the first source/drain of the first storage transistor.

In one embodiment of the present disclosure, another end of the first variable capacitance device is electrically connected to a first driver through a first wire, and the second source/drain of the first storage transistor is electrically connected to a second driver through a second wire, the third source/drain of the first control transistor is electrically connected to a third driver through a third wire, and the second gate of the first control transistor is electrically connected to a fourth driver through a fourth wire.

In one embodiment of the present disclosure, each of the memory cells further includes a second memory device, and the second memory device includes a second storage transistor, a second variable capacitance device and a second control transistor. The second storage transistor has a first gate, a first source/drain and a second source/drain. The second variable capacitance device has one end electrically connected to the first gate of the second storage transistor. The second control transistor has a second gate, a third source/drain and a fourth source/drain, where the fourth source/drain of the second control transistor is electrically connected the first source/drain of the second storage transistor.

In one embodiment of the present disclosure, another end of the first variable capacitance device and another of the second variable capacitance device are electrically connected to a first driver through a first wire, the second source/drain of the first storage transistor and the second source/drain of the second storage transistor are electrically connected to a second driver through a second wire, the third source/drain of the first control transistor and the third source/drain of the second control transistor are electrically connected to a third driver through a third wire, the second gate of the first control transistor is electrically connected to a fourth driver through a fourth wire, and the second gate of the second control transistor is electrically connected to the fourth driver through another fourth wire.

In one embodiment of the present disclosure, the first storage transistor is adjacent to the second storage transistor, and the first and second storage transistors are positioned between the first control transistor and the second control transistor, and the second wire is positioned between the fourth wire and the another fourth wire.

Yet another embodiment of the present disclosure is related to an operation method of a memory device, and the memory device includes a storage transistor, a variable capacitance device and a control transistor. The operation method comprising steps of: when programming the memory device, applying a control voltage to a control line, applying a programming voltage to a bit line, applying a zero voltage to a word line, and floating a ground line, where one end of the variable capacitance device is electrically connected to a first gate of the storage transistor, another end of the variable capacitance device is electrically connected to the word line, a first source/drain electrode of the storage transistor is electrically connected to a fourth source/drain of the control transistor, a second source/drain of the storage transistor electrically connected to the ground line, a third source/drain of the control transistor electrically connected to the bit line, and a second gate of the control transistor is electrically connected to the control line.

In one embodiment of the present disclosure, the programming voltage is greater than the control voltage, and the control voltage is greater than the zero voltage.

In one embodiment of the present disclosure, the operation method further includes steps of: when erasing the memory device, applying the control voltage to the control line, applying the zero voltage to the bit line, applying an erasing voltage to the word line, and floating the ground line.

In one embodiment of the present disclosure, the erasing voltage is greater than the control voltage, and the control voltage is greater than the zero voltage.

In one embodiment of the present disclosure, the operation method further includes steps of: when reading the memory device, applying an operating voltage to the control line, applying 0.1 times to 1.5 times the operating voltage to the bit line, applying a read voltage to the word line, and applying the zero voltage to the ground line.

In one embodiment of the present disclosure, the read voltage is lower than the programming voltage, and the read voltage is lower than the erasing voltage.

In one embodiment of the present disclosure, the operation method further includes steps of: when the memory device is not selected, applying the zero voltage to the control line, the bit line, the word line and the ground line.

In one embodiment of the present disclosure, the operation method further includes steps of: when refreshing the memory device, periodically programming the memory device every predetermined time.

Technical advantages are generally achieved, by embodiments of the present disclosure. With the technical solution of the present disclosure, the memory device does not have a huge leakage current, thereby enhancing data storage. The signal-to-noise ratio of the array of memory circuits is also improved.

Many of the attendant features will be more readily appreciated, as the same becomes better understood by reference to the following detailed description considered in connection with the accompanying drawings.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
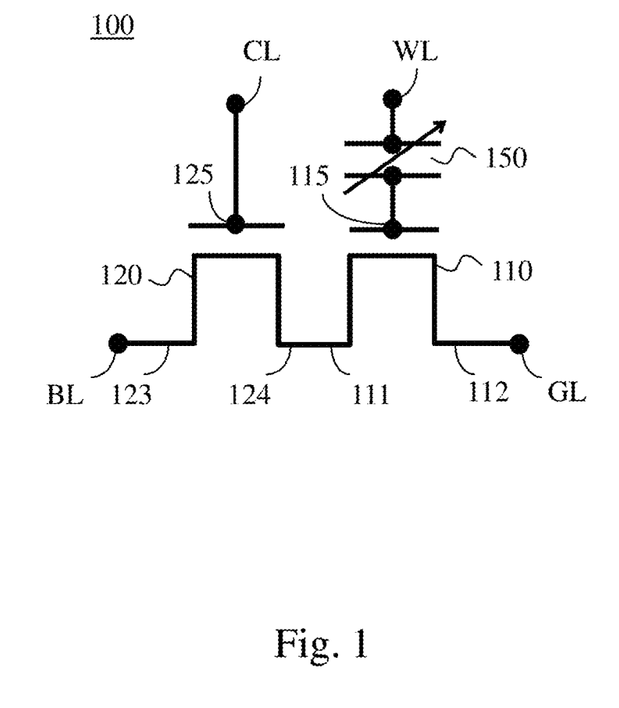
FIG. 1 is a circuit diagram of a memory device according to one embodiment of the present disclosure.
Figure 2:
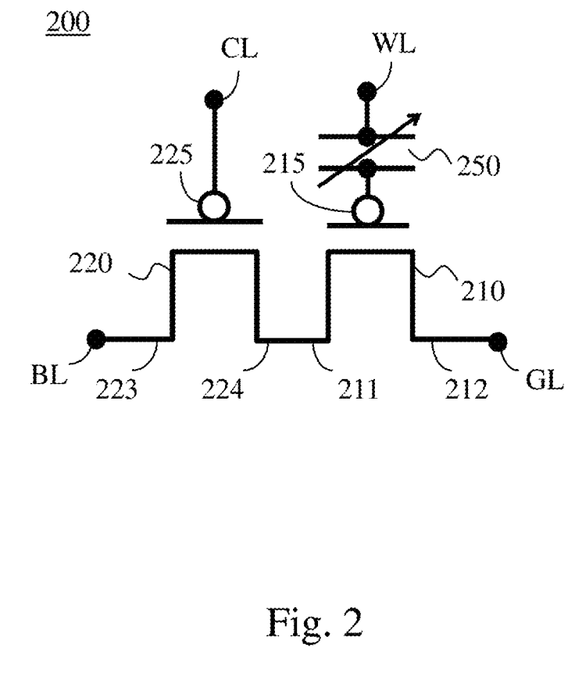
FIG. 2 is a circuit diagram of a memory device according to another embodiment of the present disclosure.

Referring to FIG. 1 and FIG. 2, in one aspect, the present disclosure is directed to memory devices 100 and 200. These memory devices may be easily integrated into a non-volatile memory or volatile memory and may be applicable or readily adaptable to all technologies. Accordingly, the memory devices 100 and 200 have advantages. Herewith the memory devices 100 and 200 are described below with FIG. 1 and FIG. 2.

The subject disclosure provides the memory devices 100 and 200 in accordance with the subject technology. Various aspects of the present technology are described with reference to the drawings. In the following description, for purposes of explanation, numerous specific details are set forth in order to provide a thorough understanding of one or more aspects. It can be evident, however, that the present technology can be practiced without these specific details. In other instances, well-known structures and devices are shown in block diagram form in order to facilitate describing these aspects. The word "exemplary" is used herein to mean "serving as an example, instance, or illustration." Any embodiment described herein as "exemplary" is not necessarily to be construed as preferred or advantageous over other embodiments.

FIG. 1 is a circuit diagram of a memory device 100 according to one embodiment of the present disclosure. As shown in FIG. 1, the memory device 100 includes a storage transistor 110, a variable capacitance device 150 and a control transistor 120. In structure, the variable capacitor device 150 is electrically connected to the first gate 115 of the storage transistor 110, and the control transistor 120 is connected to the storage transistor 110 in series. In practice, for example, the storage transistor 110 can be a NMOS transistor, the control transistor 120 can be a NMOS transistor, and the variable capacitance device 150 can be a metal-ferroelectric-metal (MFM) capacitance storage component.

In FIG. 1, the storage transistor 110 has a first gate 115, a first source/drain 111 and a second source/drain 112. One end of the variable capacitance device 150 is electrically connected to the first gate 115 of the storage transistor 110, and another end of the variable capacitance device 150 is electrically connected to the first wire WL (e.g., a word line). The second source/drain 112 of the storage transistor 110 is electrically connected to the second wire GL (e.g., a ground wire). The control transistor 120 has a second gate 125, a third source/drain 123 and a fourth source/drain 124. The fourth source/drain 124 of the control transistor 110 is electrically connected to the first source/drain 111 of the storage transistor 110. The third source/drain 123 of the control transistor 120 is electrically connected to a third wire BL (e.g., a bit line). The second gate 125 of the control transistor 120 is electrically connected a fourth wire CL (e.g., a control wire).

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. For example, The fourth source/drain 124 of the control transistor 110 and the first source/drain 111 of the storage transistor 110 can be the same diffusion region and are directly connected to each other, and the variable capacitance device 150 can be electrically coupled to the first gate 115 of the storage transistor 110 through the gate contact plug indirectly.

As to the operation method of the memory device 100, when the memory device 100 is programmed, a control voltage is applied to the fourth wire CL (control line), a programming voltage is applied to the third wire BL (bit line), and a zero voltage is approximately applied to the first wire WL (word line), and the second wire GL (ground wire) is floated. In this way, the storage state of the variable capacitance device 150 is changed by the magnitude of the programming voltage. In one embodiment of the present disclosure, the programming voltage (e.g., about 2-4V) is greater than the control voltage (e.g., about 0.9-1.2V), and the control voltage is greater than zero voltage.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

When the memory device 100 is erased, the control voltage is applied to the fourth wire CL (control line), the zero voltage is applied to the third wire BL (bit line), and an erasing voltage is applied to the first wire WL (word line), and the second wire GL (ground wire) is floated. In this way, the paths of applying the erasing voltage and the program voltage are opposite, thereby improving the stability of the operation. In one embodiment of the present disclosure, the erasing voltage is greater (e.g., about 2-4V) than the control voltage (e.g., about 0.7-1.3V), and the control voltage is greater than zero voltage.

When the memory device 100 is read, an operating voltage is applied to the fourth wire CL (control line), about 0.1 times to 1.5 times the operating voltage is applied to the third wire BL (bit line), a read voltage is applied to the first wire WL (word line), and the zero voltage is applied to the second conductor GL (ground line). The storage state of the memory device 100 is determined by sensing the current signal outputted from the memory device 100. In one embodiment of the present disclosure, the read voltage (e.g., about 0.7-1.3V) is lower than the programming voltage, the read voltage is lower than the erasing voltage, and the operating voltage (e.g., about 0.9-1.5V) is greater than or equal to the read voltage.

When the memory device 100 is not selected, the zero voltage is approximately applied the fourth wire CL (control line), the third wire BL (bit line), the first wire WL (word line) and the second wire GL (ground line). At this time, regardless of whether the variable capacitance device 150 is programmed or not, the control transistor 120 is kept in an off state, thereby effectively preventing leakage current.

When the memory device 100 is refreshed, the memory device 100 is periodically programmed every predetermined time (e.g., a time range of about one microsecond to one minute). In practice, for example, the memory device 100 serves as a volatile memory needs an additional "refresh" operation in addition to the original three operations of programming, erasing, and reading operations. The refresh operation means that in the volatile memory, the information stored in the volatile memory will pass over time, and it is necessary to periodically rewrite the information back to the memory device 100 in the memory cell (i.e., memory unit) within a predetermined time to maintain the electrical properties of the original stored information, so as to prevent the information stored in the memory device 100 from being lost.

FIG. 2 is a circuit diagram of a memory device 200 according to another embodiment of the present disclosure. As shown in FIG. 1, the memory device 200 includes a storage transistor 210, a variable capacitance device 250 and a control transistor 220. In structure, the variable capacitor device 250 is electrically connected to the first gate 215 of the storage transistor 210, and the control transistor 220 is connected to the storage transistor 210 in series. In practice, for example, the storage transistor 210 can be a PMOS transistor, the control transistor 220 can be a PMOS transistor, and the variable capacitance device 250 can be a MFM capacitance storage component.

In FIG. 2, the storage transistor 210 has a first gate 215, a first source/drain 211 and a second source/drain 212. One end of the variable capacitance device 250 is electrically connected to the first gate 215 of the storage transistor 210, and another end of the variable capacitance device 250 is electrically connected to the first wire WL (e.g., a word line). The second source/drain 212 of the storage transistor 210 is electrically connected to the second wire GL (e.g., a ground wire). The control transistor 220 has a second gate 225, a third source/drain 223 and a fourth source/drain 224. The fourth source/drain 224 of the control transistor 210 is electrically connected to the first source/drain 211 of the storage transistor 210. The third source/drain 223 of the control transistor 220 is electrically connected to a third wire BL (e.g., a bit line). The second gate 225 of the control transistor 220 is electrically connected a fourth wire CL (e.g., a control wire).

Figure 3:
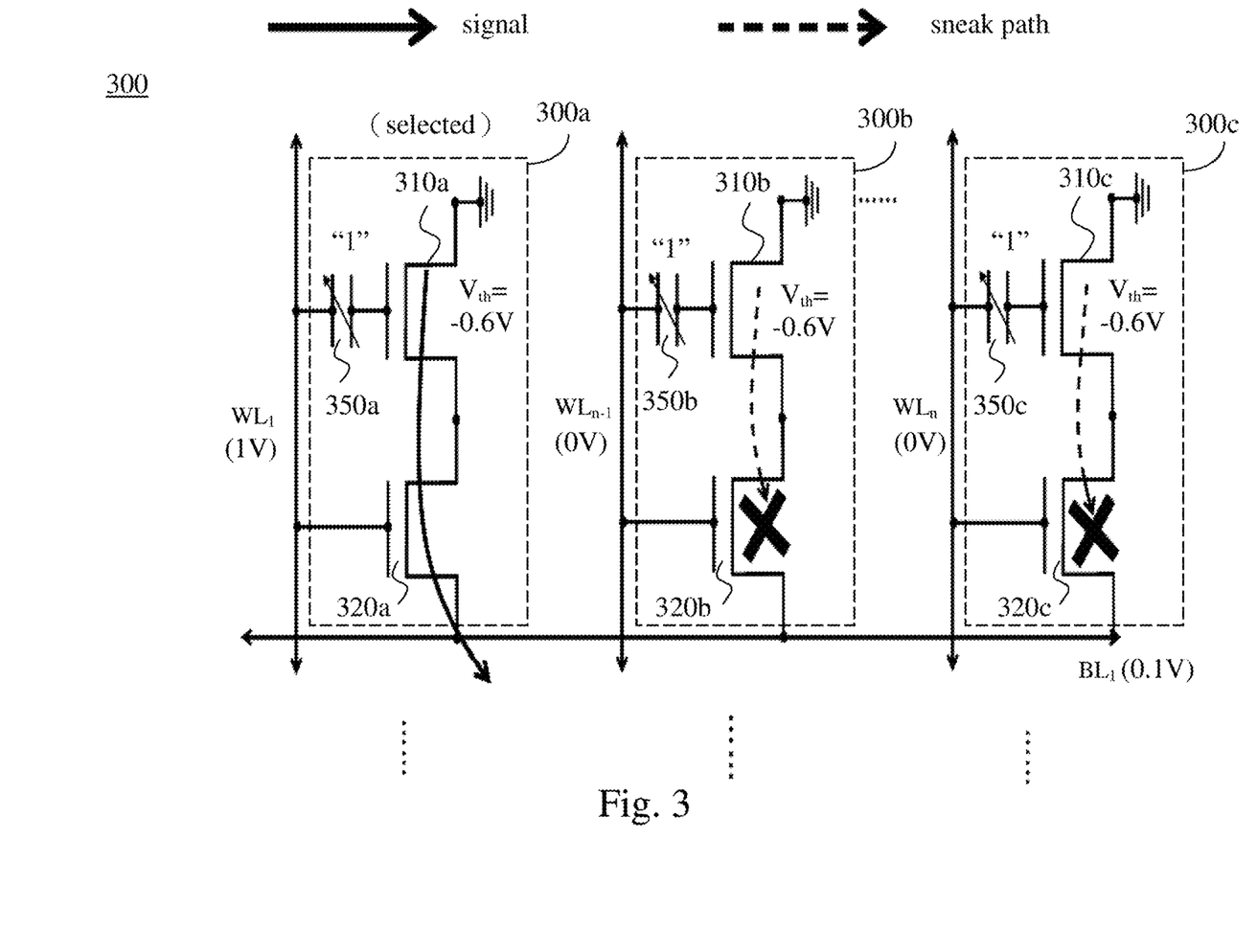
FIG. 3 is a schematic circuit diagram of a memory array in operation according to one embodiment of the present disclosure.

In order to further illustrate the generation of the above leakage current, please refer to FIGS. 1 and 3. FIG. 3 is a schematic circuit diagram of a memory array in operation according to one embodiment of the present disclosure. In structure, the control line is omitted in the memory array 300, the first wire WL1 (word line) is electrically connected to the gate of the control transistor 320$a$ and the variable capacitance device 350$a$, the first wire $W_{n-1}$ (word line) is electrically connected to the gate of the control transistor 320$b$ and the variable capacitor device 350$b$, the first wire $WL_n$ (word line) is electrically connected to the gate of the control transistor 320$c$ and the variable capacitor device 350$c$, and the third wire BL (bit line) is electrically connected to the source/drains of the control transistors 320$a$, 320$b$ and 320$c$.

As shown in FIG. 3, the memory devices 300$a$, 300$b$ and 300$c$ have all been programmed, the storage states of the variable capacitor devices 350$a$, 350$b$ and 350$c$ are all logic "1", the ferroelectric dipole potential causes the threshold voltages (Vth) of the storage transistors 310$a$, 310$b$ and 310$c$ to be negative. Even if the first wires $WL_1$, and $WL_{n-1}$, and $WL_n$ have zero voltage, the storage transistors 310$a$, 310$b$ and 310$c$ still generate the leakage current.

In operation, for example, memory device 300$a$ is selected for reading, memory devices 300$b$ and 300$c$ are not selected, and about 1V is applied to the first wire $WL_1$ (word line), about 0V is applied to the first wire $WL_{n-1}$ and $WL_n$ (word line), and about 0.1V is applied to the third wire BL1 (bit line). The storage transistor 310$a$ and the control transistor 320$a$ of the memory device 300$a$ are turned on to output a current signal, the control transistor 320$b$ of the memory device 300$b$ is turned off to block the leakage current from the storage transistor 310$b$, and the control transistor 320$c$ of the memory device 300$c$ is turned off to block the leakage current from the storage transistor 310$c$.

In a control experiment, the control transistor is omitted from the memory device, and thus the leakage current of the storage transistor cannot be blocked, causing the leakage currents of multiple storage transistors in the array to converge into a huge leakage current, thereby deteriorating data storage.

In another control experiment, the control transistor is omitted from the memory device and the variable capacitance device is connected to the source/drain of the storage transistor, and thus the current signal outputted from the selected memory device is too small. In this way, it is difficult to determine the storage state of the variable capacitor device.

Figure 4:
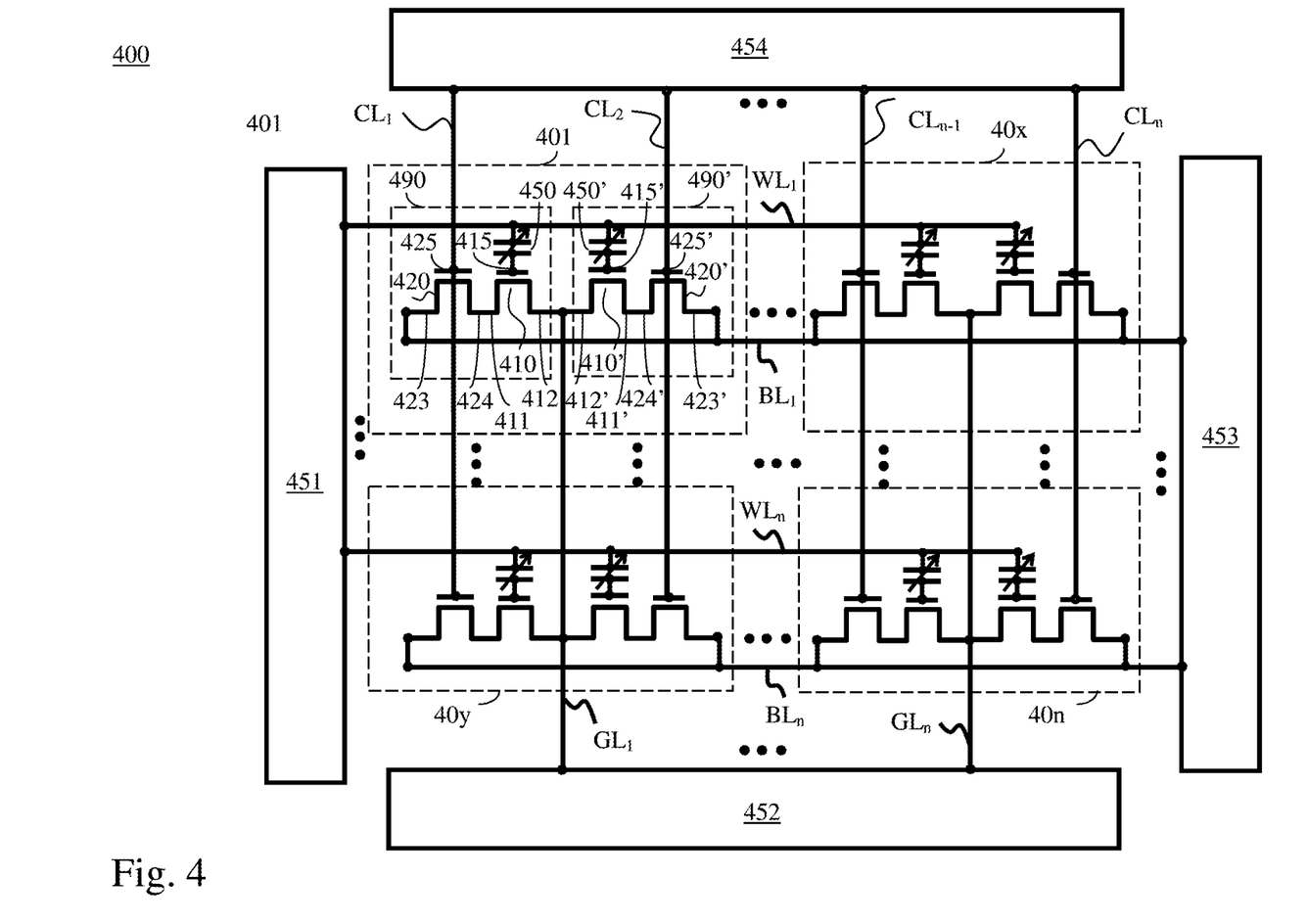
FIG. 4 is a circuit diagram of a memory circuit according to one embodiment of the present disclosure.

In order to further illustrate an array formed by the memory device 100, please refer to FIG. 4. FIG. 4 is a circuit diagram of a memory circuit according to one embodiment of the present disclosure. The memory circuit 400 includes a plurality of memory cells 401, 40$x$, 40$y$, and 40$n$ arranged in an array, and each memory cell has the same structure. Taking the memory unit 401 as an example, it includes a first memory device 490 and a second memory device 490'. In practice, for example, the memory device 100 of FIG. 1 is substantially the same as the first memory device 490 of FIG. 4, and the first memory device 490 and the second memory device 490' are arranged with symmetry.

In structure, the first memory device 490 includes a first storage transistor 410, a first variable capacitance device 450 and a first control transistor 420. The first storage transistor 410 has a first gate 415, a first source/drain 411 and a second source/drain 412. One end of the first variable capacitance device 450 is electrically connected to the first gate 415 of the first storage transistor 410. The first control transistor 420 has a second gate 425, a third source/drain 423 and a fourth source/drain 424, and the fourth source/drain 424 of the first control transistor 420 is electrically connected to the first source/drain 411 of the first storage transistor 410.

Similarly, the second memory device 490' includes a second storage transistor 410', a second variable capacitance device 450' and a second control transistor 420'. The second storage transistor 410' has a first gate 415', a first source/drain 411' and a second source/drain 412'. One end of the second variable capacitance device 450 is electrically connected to the first gate 415' of the second storage transistor 410'. The second control transistor 420' has a second gate 425', a third source/drain 423' and a fourth source/drain 424', and the fourth source/drain 424' of the second control transistor 420' is electrically connected to the first source/drain 411' of the second storage transistor 410'.

In FIG. 4, another end of the first variable capacitance device 450 and another end of the second variable capacitance device 450' are electrically connected to the first driver 451 through the first wire $WL_1$. The second source/drain 412 of the first storage transistor 410 and the second source/drain 412' of the second storage transistor 410' are electrically connected to the second driver 452 through the second wire $GL_1$, thereby saving wire connections. The third source/drain 423 of the first control transistor 420 and the third source/drain 423' of the second control transistor 420' are electrically connected to the third driver 453 through the third wire $BL_1$. The second gate 425 of the first control transistor 420 is electrically connected to the fourth driver 454 through a fourth wire $CL_1$, and the second gate 425' of the second control transistor 420' is electrically connected to the fourth driver 454 through another fourth wire $CL_2$.

In FIG. 4, the first memory device 490 and the second memory device 490' are aligned with each other along the second wire $GL_1$, thereby saving space. The first storage transistor 410 is adjacent to the second storage transistor 410', the first and second storage transistors 410 and 410' are positioned between the first control transistor 420 and the second control transistor 420', and the second wire $GL_1$ is positioned between the fourth wire $CL_1$ and the another fourth wire $CL_2$.

In addition, the connections among the first wire $WL_n$, the second wire $GL_n$, the third wire $BL_n$, the fourth wire $CL_{n-1}$ and $CL_n$ and the other memory cells 40$x$, 40$y$, 40$n$ can be deduced by analogy, and are not be repeated herein.

In practice, for example, the first wires $WL_1$ and $WL_n$ may be word lines, and the first driver 451 can be a word line driver. The second wires $GL_1$ and $GL_n$ can be ground lines, and the second driver 452 can be a ground line driver. The third wires $BL_1$ and $BL_n$ can be bit lines, and the third driver 453 can be a bit line driver with a sense amplifier. The fourth wires $CL_1$, $CL_2$, $CL_{n-1}$ and $CL_n$ may be control lines, and the fourth driver 454 can be a control line driver.

Taking the operation method of the memory device 490 as an example, when programming the memory device 490, the fourth driver 454 applies a control voltage (e.g., about 0.9-1.2V) to the fourth wire $CL_1$ (control line), and the third drivers 453 applies a programming voltage (e.g., about 2-4V) to the third wire $BL_1$ (bit line), the first driver 451 applies approximately zero voltage to the first wire $WL_1$ (word line), and the second driver 452 floats the second wire $GL_1$ (ground wire). In this way, the third driver 453 changes the storage state of the variable capacitance device 450 through the magnitude of the programming voltage.

When erasing the memory device 490, the fourth driver 454 applies a control voltage (e.g., about 0.9-1.2V) to the fourth wire $CL_1$ (control wire), the third driver 453 applies the zero voltage to the third wire $BL_1$ (bit line), the first driver 451 applies an erase voltage (e.g., about 2-4V) to the first wire $WL_1$ (word line), and the second driver 452 floats the second wire $GL_1$ (ground wire). In this way, the paths of applying the erasing voltage and the program voltage are opposite, thereby improving the stability of the operation.

When reading the memory device 490, the fourth driver 454 applies an operating voltage (e.g., about 0.9-1V) to the fourth wire $CL_1$ (control wire), the third driver 453 applies about 0.1 times to 1 times the operating voltage to the third wire $BL_1$ (bit Line), the first driver 451 applies a read voltage (e.g., about 0.7-1.9V) to the first wire $WL_1$ (word line), and the second driver 452 applies the zero voltage to the second wire $GL_1$ (ground line). In this way, the third driver 453 (e.g., the bit line driver with the sense amplifier) sense the current signal outputted from the memory device 490 to determine the storage state of the memory device 490.

When the memory device 490 is not selected, the fourth driver 454, the third driver 453, the first driver 451, and the second driver 452 apply the zero voltage to the fourth wire $CL_1$ (control wire), the third wire $BL_1$ (bit Line), the first wire $WL_1$ (word line), and the second wire $GL_1$ (ground line) respectively. At this time, regardless of whether the variable capacitance device 450 is programmed or not, the control transistor 420 is kept in an off state, thereby effectively preventing leakage current.

Moreover, for example, the memory circuit 400 serves as a volatile memory circuit, in which the memory device 490 serves as a volatile memory. When the memory device 490 is refreshed, the memory device 490 is periodically programmed every predetermined time (e.g., a time range of about one microsecond to one minute) to maintain the electrical properties of the original stored information, so as to prevent the information stored in the memory device 490 from being lost.

In addition, the operation methods of other memory devices in the memory circuit 400 can be deduced by analogy and are not be repeated herein.

Figure 5:
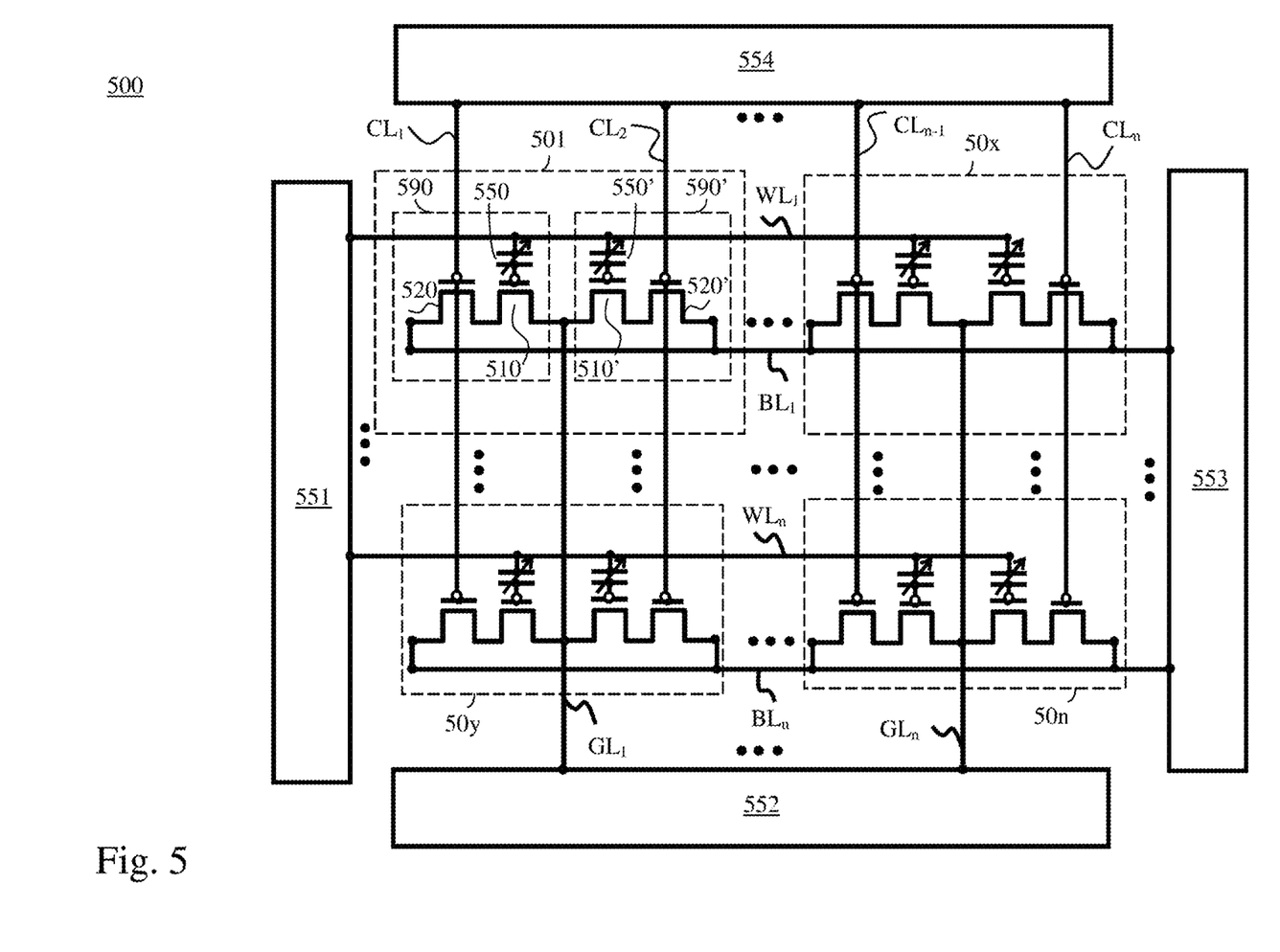
FIG. 5 is a circuit diagram of a memory circuit according to another embodiment of the present disclosure.

In order to further illustrate an array formed by the memory device 200, refer to FIG. 5. FIG. 5 is a circuit diagram of a memory circuit 500 according to another embodiment of the present disclosure. The memory circuit 500 includes a plurality of memory cells 501, 50x, 50y and 50n arranged in an array, and each memory cell has the same structure. Taking the memory unit 501 as an example, it includes a first memory device 590 and a second memory device 590'. The first memory device 590 includes a first storage transistor 510, a first variable capacitance device 550 and a first control transistor 520, and the second memory device 590' includes a second storage transistor 510', a second variable capacitance device 550' and a second control transistor 520'. In practice, for example, the memory device 200 of FIG. 2 is substantially the same as the first memory device 590 of FIG. 5, and the first memory device 590 and the second memory device 590' are arranged with symmetry. The first, second, third and fourth drivers 451, 452, 453 and 454 in FIG. 4 can be structurally equivalent to the first, second, third and fourth drivers 551, 552, 553 and 554 in FIG. 5.

The memory circuit 500 is substantially the same as the memory circuit 400 except that the storage transistors 510 and 510' and the control transistors 520 and 520' in FIG. 5 are PMOS transistors, and the storage transistors 410 and 410' and the control transistors 420 and 420' in FIG. 4 are NMOS transistors. The operation method of the memory device in the memory circuit 500 can also be derived by referring to the operation method of the memory device in the memory circuit 400 in FIG. 4, and is not described in detail herein.

Figure 6:
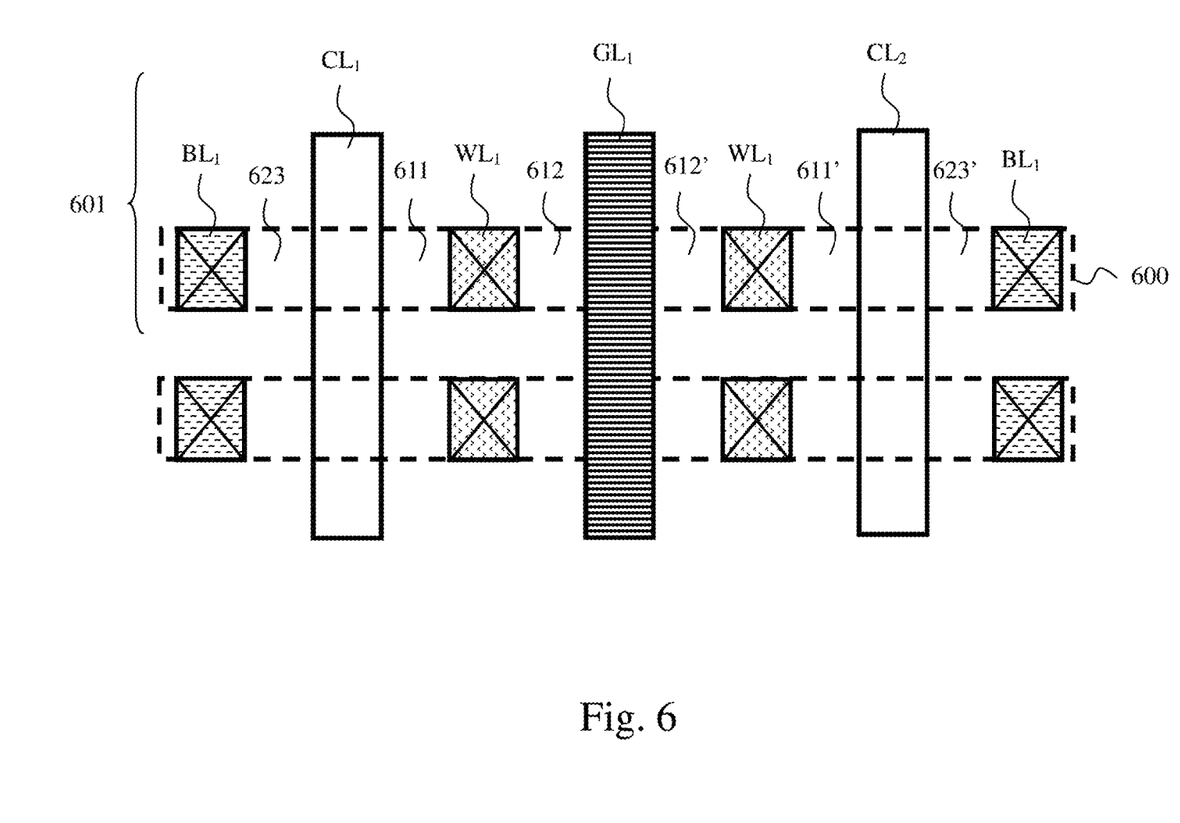
FIG. 6 a schematic diagram illustrating a layout of the memory circuit as shown in FIG. 4 or FIG. 5 according to one embodiment of the present disclosure.

FIG. 6 a schematic diagram illustrating a layout of the memory circuit as shown in FIG. 4 or FIG. 5 according to one embodiment of the present disclosure.

Referring to FIGS. 4 and 6, in one embodiment of the present disclosure, the memory cell 601 in FIG. 6 can correspond to the memory cell 401 in FIG. 4, the second source/drain 412 of the first storage transistor 410 can correspond to the source/drain diffusion region 612, and the second source/drain electrode 412' of the second storage transistor 410' can correspond to the source/drain electrode diffusion region 612'. In practice, for example, the source/drain diffusion region 612 and the source/drain diffusion region 612' may be the same diffusion region and are connected to each other. The first source/drain 411 of the first storage transistor 410 and the fourth source/drain 424 of the first control transistor 420 share the same source/drain diffusion region 611; similarly, the first source/drain 411' of the second storage transistor 410' and the fourth source/drain 424' of the second control transistor 420' share the same source/drain diffusion region 611'. The third source/drain 423 of the first control transistor 420 corresponds to the source/drain diffusion region 623; similarly, the third source/drain 423' of the second control transistor 420' corresponds to the source/drain diffusion region 623'. The source/drain diffusion regions 611, 612, 623, 611', 612' and 623' are all formed in the active region 600 (e.g., an active region of the semiconductor substrate).

Referring to FIGS. 5 and 6, in one embodiment of the present disclosure, the memory unit 601 in FIG. 6 can correspond to the memory unit 501 in FIG. 5. The relationships of components in FIGS. 5 and 6 are the same as the relationships of components in FIGS. 4 and 6, and are not repeated herein.

Figure 7:
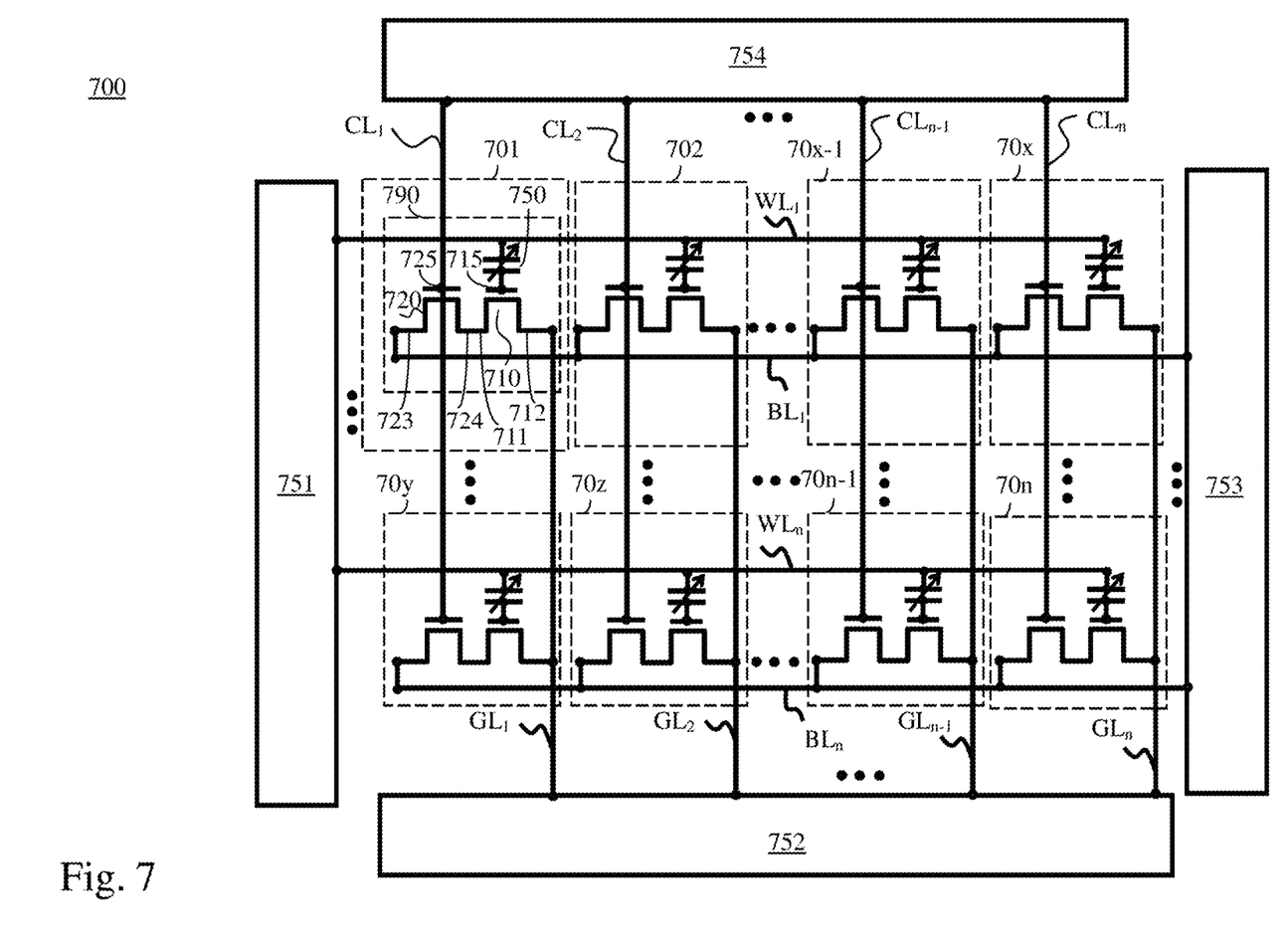
FIG. 7 is a circuit diagram of a memory circuit according to yet another embodiment of the present disclosure.

In order to further illustrate another array formed by the memory device 100, refer to FIG. 7. FIG. 7 is a circuit diagram of a memory circuit according to yet another embodiment of the present disclosure. The memory circuit 700 includes a plurality of memory cells 701, 702, 70x-1, 70x, 70y, 70z, 70n-1 and 70n arranged in an array, and each memory cell has the same structure. Taking the memory unit 701 as an example, it includes a first memory device 790. In practice, for example, the memory device 100 of FIG. 1 is substantially the same as the first memory device 790 of FIG. 7.

In structure, the first memory device 790 includes a first storage transistor 710, a first variable capacitance device 750 and a first control transistor 720. The first storage transistor 710 has a first gate 715, a first source/drain 711 and a second source/drain 712. One end of the first variable capacitance device 750 is electrically connected to the first gate 715 of the first storage transistor 710. The first control transistor 720 has a second gate 725, a third source/drain 723 and a fourth source/drain 724, and the fourth source/drain 724 of the first control transistor 720 is electrically connected to the first source/drain 711 of the first storage transistor 710.

In FIG. 7, another end of the first variable capacitance device 750 is electrically connected to the first driver 751 through the first wire $WL_1$. The second source/drain 712 of the first storage transistor 710 is electrically connected to the second driver 452 through the second wire $GL_1$, thereby saving wire connections. The third source/drain 723 of the first control transistor 720 is electrically connected to the third driver 753 through the third wire $BL_1$. The second gate 725 of the first control transistor 720 is electrically connected to the fourth driver 754 through a fourth wire $CL_1$.

In addition, the connections among the first wire $WL_n$, the second wire $GL_2$, $GL_{n-1}$ and $GL_n$, the third wire $BL_n$, the fourth wire $CL_2$, $CL_{n-1}$ and $CL_n$ and the other memory cells 702, 70x-1, 70x, 70y, 70z, 70n-1 and 70n can be deduced by analogy, and are not be repeated herein.

In practice, for example, the first wires $WL_1$ and $WL_n$ may be word lines, and the first driver 751 can be a word line driver. The second wires $GL_1$, $GL_2$, $GL_{n-1}$ and $GL_n$ can be ground lines, and the second driver 752 can be a ground line driver. The third wires $BL_1$ and $BL_n$ can be bit lines, and the third driver 453 can be a bit line driver with a sense amplifier. The fourth wires $CL_Q$, $CL_2$, $CL_{n-1}$ and $CL_n$ may be control lines, and the fourth driver 454 can be a control line driver.

The operation method of the memory device 790 is the same as the operation method of the memory device 490, and is not repeated herein.

Figure 8:
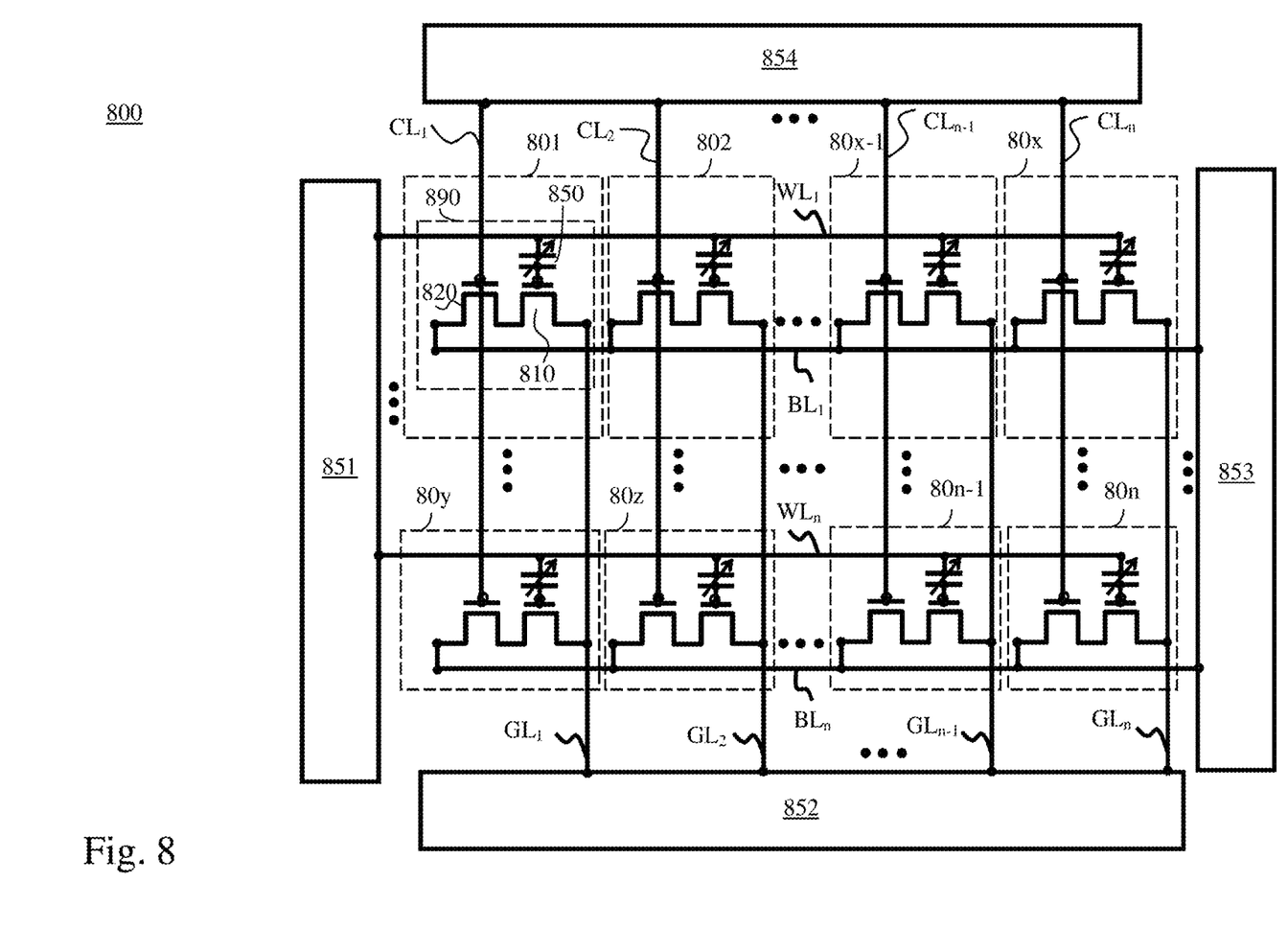
FIG. 8 is a circuit diagram of a memory circuit according to still yet another embodiment of the present disclosure.

In order to further illustrate another array formed by the memory device 200, refer to FIG. 8. FIG. 8 is a circuit diagram of a memory circuit 800 according to still yet another embodiment of the present disclosure. The memory circuit 800 includes a plurality of memory cells 801, 802, 80x-1, 80x, 80y, 80z, 80n-1, and 80n arranged in an array, and each memory cell has the same structure. Taking the memory unit 801 as an example, it includes a first memory device 890. The first memory device 890 includes a first storage transistor 810, a first variable capacitance device 850 and a first control transistor 820. In practice, for example, the memory device 200 in FIG. 2 is substantially the same as the first memory device 890 in FIG. 8. The first, second, third and fourth drivers 751, 752, 753 and 754 in FIG. 7 can be structurally equivalent to the first, second, third and fourth drivers 851, 852, 853 and 854 in FIG. 8.

The memory circuit 800 is substantially the same as the memory circuit 700 except that the storage transistors 810 and the control transistors 820 8in FIG. 8 are PMOS transistors, and the storage transistors 710 and the control transistors 720 in FIG. 7 are NMOS transistors. Therefore, the structure of the memory circuit 800 is not repeated herein.

Figure 9:
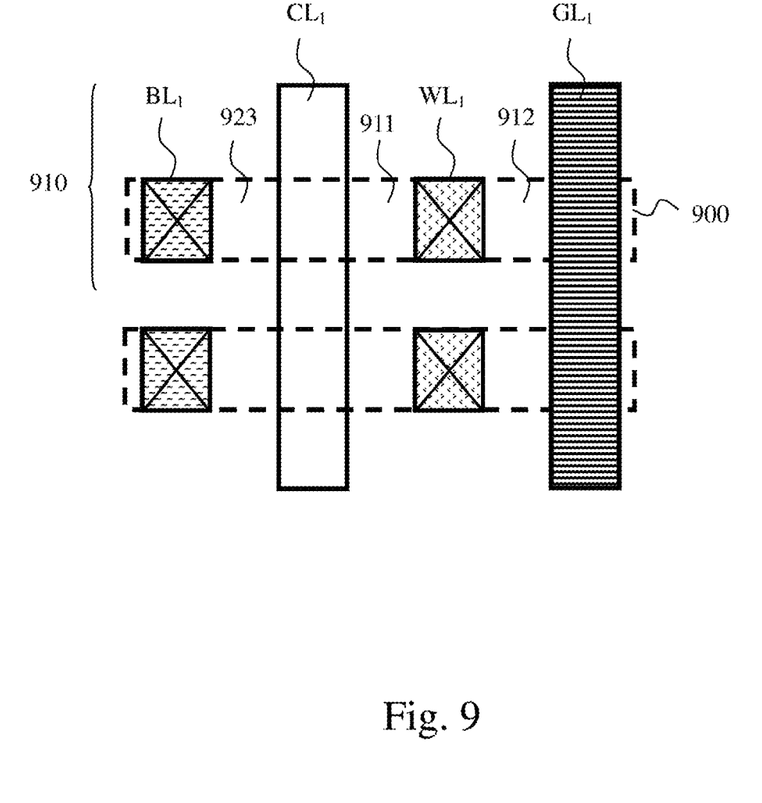
FIG. 9 a schematic diagram illustrating a layout of the memory circuit as shown in FIG. 7 or FIG. 8 according to one embodiment of the present disclosure.

FIG. 9 a schematic diagram illustrating a layout of the memory circuit as shown in FIG. 7 or FIG. 8 according to one embodiment of the present disclosure.

Referring to FIGS. 7 and 9, in one embodiment of the present disclosure, the memory cell 901 in FIG. 9 can correspond to the memory cell 701 in FIG. 7, and the second source/drain 712 of the first storage transistor 710 can correspond to the source/drain diffusion region 912. The first source/drain 711 of the first storage transistor 710 and the fourth source/drain 724 of the first control transistor 720 share the same source/drain diffusion region 911. The third source/drain 723 of the first control transistor 720 corresponds to the source/drain diffusion region 923. The source/drain diffusion regions 911, 912, and 923 are all formed in the active region 900 (e.g., an active region of the semiconductor substrate).

Referring to FIGS. 8 and 9, in one embodiment of the present disclosure, the memory unit 901 in FIG. 9 can correspond to the memory unit 801 in FIG. 8. The relationships of components in FIGS. 8 and 9 are the same as the relationships of components in FIGS. 7 and 9, and are not repeated herein.

Figure 10:
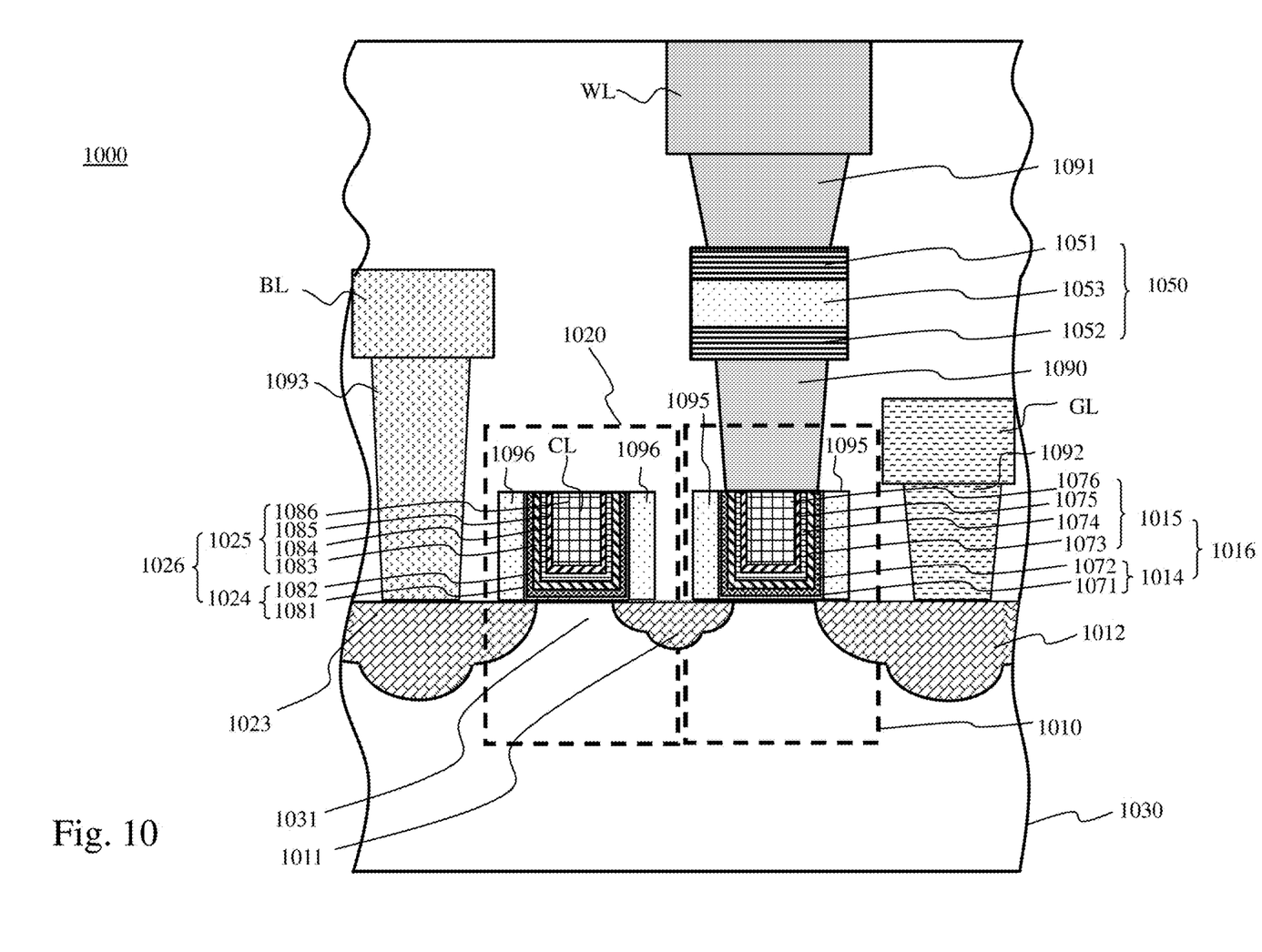
FIG. 10 is a schematic cross-sectional view of a memory device according to one embodiment of the present disclosure.

FIG. 10 is a schematic cross-sectional view of a memory device 1000 according to one embodiment of the present disclosure. In practice, the architecture of the memory device 1000 is applicable to any of the above-mentioned memory devices.

As shown in FIG. 10, the memory device 1000 includes a storage transistor 1010, a variable capacitance device 1050 and a control transistor 1020. In structure, the variable capacitance device 1050 is electrically connected to the gate 1016 of the storage transistor 1010, and the control transistor 1020 is connected to the storage transistor 1010 in series.

In FIG. 10, the variable capacitance device 1050 includes an upper electrode 1051, a lower electrode 1052 and a variable capacitance layer 1053. In structure, the lower electrode 1052 is electrically connected to the gate electrode 1016 of the storage transistor 1010, and the variable capacitance layer 1053 is disposed between the upper electrode 1051 and the lower electrode 1052. In practice, for example, the variable capacitance layer 1053 is a ferroelectric layer, which has storage characteristics of bipolar variable capacitance.

In FIG. 10, one end of the first contact plug 1091 contacts the upper electrode 1051, the first wire WL contacts another end of the first contact plug 1091, and the first contact plug 1091 is positioned between the first wire WL and the upper electrode 1051.

In one embodiment of the present disclosure, the storage transistor 1010 includes a first gate dielectric layer 1014, a first gate electrode layer 1015, a first source/drain diffusion region 1011 and a second source/drain electrode diffusion region 1012. In structure, the first gate dielectric layer 1014 is disposed on the active region 1030, the first gate electrode layer 1015 is disposed on the first gate dielectric layer 1014, the first gate electrode layer 1015 contacts one end of the gate contact plug 1090, another end of the gate contact plug 1090 contacts the lower electrode 1052 of the variable capacitance device 1050. The first source/drain diffusion region 1011 and the second source/drain diffusion region 1012 are disposed in the active region 1030 and positioned at two opposing sides respectively under the first gate electrode layer 1015.

In practice, for example, the first gate dielectric layer 1014 includes an interfacial layer 1071 and a high-k dielectric layer 1072. In structure, the interfacial layer 1071 is disposed on the active region 1030, the high-k dielectric layer 1072 is disposed on the interfacial layer 1071, and the gate spacers 1905 are disposed on both sides of the interfacial layer 1071.

In practice, for example, the first gate electrode layer 1015 includes a barrier metal layer 1073, a work function metal layer 1074, a buffer metal layer 1075 and a contact metal layer 1076. In structure, the barrier metal layer 1073 is disposed on the high-k dielectric layer 1072, the work function metal layer 1074 is disposed on the barrier metal layer 1073, the buffer metal layer 1075 is disposed on the work function metal layer 1074, and the contact metal layer 1076 is disposed on the buffer metal layer 1075.

In FIG. 10, one end of the second contact plug 1092 contacts the second source/drain diffusion region 1012, the second wire GL contacts another end of the second contact plug 1092, and the second contact plug 1092 between the second wire GL and the second source/drain diffusion region 1012.

In one embodiment of the present disclosure, the control transistor 1010 and the storage transistor 1020 share the first source/drain diffusion region 1011. The control transistor 1020 includes a gate 1026, a third source/drain diffusion region 1023 and a first source/drain diffusion region 1011, in which the gate 1026 includes a second gate dielectric layer 1024 and a second gate electrode layer 1025. The second gate dielectric layer 1024 is disposed on the active region 1030, and the second gate electrode layer 1025 is disposed on the second gate dielectric layer 1024. The third source/drain diffusion region 1023 and the first source/drain diffusion region 1011 are disposed in the active region 1030 and positioned at two opposing sides respectively under the second gate electrode layer 1025.

In practice, for example, the second gate dielectric layer 1024 includes an interfacial layer 1081 and a high-k dielectric layer 1082. In structure, the interfacial layer 1081 is disposed on the active region 1030, the high-k dielectric layer 1082 is disposed on the interfacial layer 1081, and the gate spacers 1906 are disposed on both sides of the interfacial layer 1081.

In practice, for example, the second gate electrode layer 1025 includes a barrier metal layer 1083, a work function metal layer 1084, a buffer metal layer 1085 and a contact metal layer 1086. In structure, the barrier metal layer 1083 is disposed on the high-k dielectric layer 1082, the work function metal layer 1084 is disposed on the barrier metal layer 1083, the buffer metal layer 1085 is disposed on the work function metal layer 1084, and the contact metal layer 1086 is disposed on the buffer metal layer 1085.

In FIG. 10, one end of the third contact plug 1093 contacts the third source/drain diffusion region 1023, the third wire BL contacts another end of the third contact plug 1093, and the third contact plug 1093 between the third wire BL and the third source/drain diffusion region 1023. The second gate electrode layer 1025 of the control transistor 1020 is used as the fourth wire CL; specifically, the contact metal layer 1086 in the second gate electrode layer 1025 of the control transistor 1020 is connected to or shared with the fourth wire CL.

In a control experiment, the variable capacitance device is fabricated in the gate of the storage transistor, but this manner greatly increases the difficulty of the semiconductor process, and the storage characteristics are unstable.

In view of the above, technical advantages are generally achieved, by embodiments of the present disclosure. With the technical solution of the present disclosure, the memory device does not have a huge leakage current, thereby enhancing data storage. The signal-to-noise ratio of the array of memory circuits is also improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory device, comprising:
   a storage transistor;
   a variable capacitance device electrically connected to a gate of the storage transistor; and
   a control transistor electrically connected to the storage transistor in series,
   wherein the variable capacitance device comprises:
   an upper electrode;
   a lower electrode electrically connected to the gate of the storage transistor; and
   a variable capacitance layer disposed between the upper electrode and the lower electrode,
   wherein the storage transistor comprises:
   at least one first gate dielectric layer disposed on an active region;
   at least one first gate electrode layer disposed on the at least one first gate dielectric layer, the at least one first gate electrode layer contacting one end of a gate contact plug, and another end of the gate contact plug contacting the lower electrode of the variable capacitance device; and
   a first source/drain diffusion region and a second source/drain diffusion region disposed in the active region and positioned at two opposing sides respectively under the at least one first gate electrode layer.

2. The memory device of claim 1, wherein the variable capacitance layer is a ferroelectric layer.

3. The memory device of claim 1, further comprising:
   a first contact plug having one end contacting the upper electrode; and
   a first wire contacting another end of the first contact plug, and the first contact plug positioned between the first wire and the upper electrode.

4. The memory device of claim 1, further comprising:
   a second contact plug having one end contacting the second source/drain diffusion region; and
   a second wire contacting another end of the second contact plug, and the second contact plug positioned between the second wire and the second source/drain diffusion region.

5. The memory device of claim 1, wherein the control transistor and the storage transistor share the first source/drain diffusion region, and the control transistor comprises:
   at least one second gate dielectric layer disposed on the active region;
   at least one second gate electrode layer disposed on the at least one second gate dielectric layer; and
   a third source/drain diffusion region and the first source/drain diffusion region disposed in the active region and positioned at two opposing sides respectively under the at least one second gate electrode layer.

6. The memory device of claim 5, further comprising:
   a third contact plug having one end contacting the third source/drain diffusion region; and
   a third wire contacting another end of the third contact plug, the third contact plug positioned between the third wire and the third source/drain diffusion region, wherein the at least one second gate electrode layer of the control transistor serves as a fourth wire.

7. A memory circuit, comprising:
   a plurality of memory cells arranged in an array, each of the memory cells comprising a first memory device, and the first memory device comprising:
   a first storage transistor having a first gate, a first source/drain and a second source/drain;

a first variable capacitance device having one end electrically connected to the first gate of the first storage transistor; and a first control transistor having a second gate, a third source/drain and a fourth source/drain, wherein the fourth source/drain of the first control transistor is electrically connected to the first source/drain of the first storage transistor, wherein another end of the first variable capacitance device is electrically connected to a first driver through a first wire, and the second source/drain of the first storage transistor is electrically connected to a second driver through a second wire, the third source/drain of the first control transistor is electrically connected to a third driver through a third wire, and the second gate of the first control transistor is electrically connected to a fourth driver through a fourth wire.

8. The memory circuit of claim 7, wherein each of the memory cells further comprises a second memory device, and the second memory device comprises:

a second storage transistor having a first gate, a first source/drain and a second source/drain;

a second variable capacitance device having one end electrically connected to the first gate of the second storage transistor; and a second control transistor having a second gate, a third source/drain and a fourth source/drain, wherein the fourth source/drain of the second control transistor is electrically connected the first source/drain of the second storage transistor.

9. The memory circuit of claim 8, wherein another of the second variable capacitance device is electrically connected to the first driver through the first wire, the second source/drain of the second storage transistor is electrically connected to the second driver through the second wire, the third source/drain of the second control transistor is electrically connected to the third driver through the third wire, and the second gate of the second control transistor is electrically connected to the fourth driver through another fourth wire.

10. The memory circuit of claim 9, wherein the first storage transistor is adjacent to the second storage transistor, and the first and second storage transistors are positioned between the first control transistor and the second control transistor, and the second wire is positioned between the fourth wire and the another fourth wire.

11. An operation method of a memory device, the memory device comprising a storage transistor, a variable capacitance device and a control transistor, the operation method comprising steps of:

when programming the memory device, applying a control voltage to a control line, applying a programming voltage to a bit line, applying a zero voltage to a word line, and floating a ground line, wherein one end of the variable capacitance device is electrically connected to a first gate of the storage transistor, another end of the variable capacitance device is electrically connected to the word line, a first source/drain electrode of the storage transistor is electrically connected to a fourth source/drain of the control transistor, a second source/drain of the storage transistor electrically connected to the ground line, a third source/drain of the control transistor electrically connected to the bit line, and a second gate of the control transistor is electrically connected to the control line.

12. The operation method of claim 11, wherein the programming voltage is greater than the control voltage, and the control voltage is greater than the zero voltage.

13. The operation method of claim 11, further comprising:

when erasing the memory device, applying the control voltage to the control line, applying the zero voltage to the bit line, applying an erasing voltage to the word line, and floating the ground line.

14. The operation method of claim 13, wherein the erasing voltage is greater than the control voltage, and the control voltage is greater than the zero voltage.

15. The operation method of claim 13, further comprising:

when reading the memory device, applying an operating voltage to the control line, applying 0.1 times to 1.5 times the operating voltage to the bit line, applying a read voltage to the word line, and applying the zero voltage to the ground line.

16. The operation method of claim 15, wherein the read voltage is lower than the programming voltage, and the read voltage is lower than the erasing voltage.

17. The operation method of claim 11, further comprising:

when the memory device is not selected, applying the zero voltage to the control line, the bit line, the word line and the ground line.

18. The operation method of claim 11, further comprising:

when refreshing the memory device, periodically programming the memory device every predetermined time.

* * * * *